United States Patent
Lill et al.

(10) Patent No.: US 10,249,521 B2
(45) Date of Patent: Apr. 2, 2019

(54) WET-DRY INTEGRATED WAFER PROCESSING SYSTEM

(71) Applicant: LAM RESEARCH AG, Villach (AT)

(72) Inventors: Thorsten Lill, Santa Clara, CA (US); Andreas Fischer, Castro Valley, CA (US); Richard H. Gould, Fremont, CA (US); Michael Myslovaty, San Jose, CA (US); Philipp Engesser, Villach (AT); Harald Okorn-Schmidt, Klagenfurt (AT); Anders Joel Bjork, Villach (AT)

(73) Assignee: LAM RESEARCH AG, Villach (AT)

( * ) Notice: Subject to any disclaimer, the term of this patent is extended or adjusted under 35 U.S.C. 154(b) by 281 days.

(21) Appl. No.: 15/073,368

(22) Filed: Mar. 17, 2016

(65) Prior Publication Data

US 2017/0271180 A1    Sep. 21, 2017

(51) Int. Cl.
*H01L 21/67* (2006.01)
*H01L 21/673* (2006.01)

(52) U.S. Cl.
CPC .. *H01L 21/67207* (2013.01); *H01L 21/67167* (2013.01); *H01L 21/67196* (2013.01); *H01L 21/67389* (2013.01)

(58) Field of Classification Search
CPC ......... H01L 21/67207; H01L 21/67167; H01L 21/67196; H01L 21/67389
See application file for complete search history.

(56) References Cited

U.S. PATENT DOCUMENTS

| | | | |
|---|---|---|---|
| 6,244,811 B1 | 6/2001 | Kroeker et al. | |
| 6,811,962 B2 * | 11/2004 | Yoshihara | G03D 3/06 396/611 |
| 6,823,876 B1 * | 11/2004 | Chang | B08B 9/00 134/149 |
| 7,159,599 B2 | 1/2007 | Verhaverbeke et al. | |
| 8,007,634 B2 * | 8/2011 | Park | H01L 21/6708 134/119 |
| 8,185,242 B2 | 5/2012 | Wong et al. | |
| 8,771,804 B2 | 7/2014 | Dordi et al. | |
| 9,023,732 B2 * | 5/2015 | Wang | H01L 21/6708 438/706 |
| 9,117,860 B2 | 8/2015 | Boyd et al. | |
| 9,666,414 B2 * | 5/2017 | Lubomirsky | C23C 16/0245 |
| 10,090,181 B2 * | 10/2018 | Lee | H01L 21/68742 |

(Continued)

*Primary Examiner* — Saul Rodriguez
*Assistant Examiner* — Ashley K Romano

(57) ABSTRACT

An apparatus for processing wafer-shaped articles comprises a vacuum transfer module and an atmospheric transfer module. A first airlock interconnects the vacuum transfer module and the atmospheric transfer module. An atmospheric process module is connected to the atmospheric transfer module. A gas supply system is configured to supply gas separately and at different controlled flows to each of the atmospheric transfer module, the first airlock and the atmospheric process module, so as to cause: (i) a flow of gas from the first airlock to the atmospheric transfer module when the first airlock and the atmospheric transfer module are open to one another, and (ii) a flow of gas from the atmospheric transfer module to the atmospheric process module when the atmospheric transfer module and the atmospheric process module are open to one another.

20 Claims, 3 Drawing Sheets

(56) References Cited

U.S. PATENT DOCUMENTS

| | | |
|---|---|---|
| 2007/0292615 A1 | 12/2007 | Dordi et al. |
| 2008/0057221 A1 | 3/2008 | Boyd et al. |
| 2008/0081485 A1 | 4/2008 | Papanu et al. |
| 2013/0062839 A1 | 3/2013 | Tschinderle et al. |

* cited by examiner

WET-DRY INTEGRATED WAFER PROCESSING SYSTEM

BACKGROUND OF THE INVENTION

1. Field of the Invention

The invention relates to a system for processing wafer-shaped articles in which wet and dry process modules are integrated.

2. Description of Related Art

Processing of semiconductor wafers is performed using various process modules. Some process modules, such as those for plasma etching, are conducted in a vacuum environment and are considered to involve "dry" processes. Other process modules utilize various processing liquids and are conducted in an ambient pressure environment, for example wet etching and/or cleaning, and are considered "wet" processes.

U.S. Patent Pub. No. 2008/0057221 describes a controlled ambient system for interface engineering, in which a lab-ambient environment and a controlled ambient environment are combined.

In practice, however, it has seldom been efficient to combine wet and dry process modules, because the wafer throughput for these types of modules differs considerably. Thus, the wet and dry process modules are conventionally operated independently of one another. The wait times for wafers to be processed in one type of module, after having been processed in the other type of module, can be significant. For example, in a semiconductor manufacturing facility, it is not unusual for a wafer to have a wait time of a few hours or more after undergoing plasma etching, before the wafer can be rinsed in a wet process module.

The present inventors have discovered that wafers awaiting their turn for wet processing can undergo slow-rate reactions on the device structures formed on the wafers, as a result of reactive etch residues such as halogens that remain on the wafer surface. This has provided an impetus to develop improved systems that integrate wet and dry process modules, to greatly reduce the wait times between carrying out the wet and dry processing of wafers.

SUMMARY OF THE INVENTION

Thus, in one aspect, the present invention relates to an apparatus for processing wafer-shaped articles, comprising a vacuum transfer module and an atmospheric transfer module. A first airlock interconnects the vacuum transfer module and the atmospheric transfer module. An atmospheric process module is connected to the atmospheric transfer module. A gas supply system is configured to supply gas separately and at different controlled flows to each of the atmospheric transfer module, the first airlock and the atmospheric process module, so as to cause:

(i) a flow of gas from the first airlock to the atmospheric transfer module when the first airlock and the atmospheric transfer module are open to one another, and (ii) a flow of gas from the atmospheric transfer module to the atmospheric process module when the atmospheric transfer module and the atmospheric process module are open to one another.

In preferred embodiments of the apparatus according to the present invention, the gas supply system comprises a first gas showerhead positioned in an upper region of the first air lock, and configured to dispense gas downwardly within the first airlock.

In preferred embodiments of the apparatus according to the present invention, the first airlock is configured to accommodate at least one wafer-shaped article of a predetermined diameter, and the first gas showerhead comprises downwardly directed gas discharge openings positioned radially outwardly of a wafer-shaped article of the predetermined diameter when positioned in the first airlock. Preferably the gas discharge openings are located at a distance to the vertical chamber walls of the first airlock less than 5 cm.

In preferred embodiments of the apparatus according to the present invention, the gas supply system comprises a second gas showerhead positioned in an upper region of the atmospheric transfer module, and configured to dispense gas downwardly within the atmospheric transfer module.

In preferred embodiments of the apparatus according to the present invention, the atmospheric transfer module is configured to accommodate at least one wafer-shaped article of a predetermined diameter, and the second gas showerhead comprises downwardly directed gas discharge openings positioned radially outwardly of a wafer-shaped article of the predetermined diameter when positioned in the atmospheric transfer module. Preferably the gas discharge openings are located at a distance to the vertical chamber walls of the atmospheric transfer module less than 5 cm. Alternatively, the gas discharge openings are annularly arranged in a ring having a diameter at least 5 mm greater than the diameter of the wafer-shaped article to be treated.

In preferred embodiments of the apparatus according to the present invention, the gas supply system comprises a first exhaust positioned in a lower region of the atmospheric transfer module, and configured to exhaust at least a part of the gas discharged from the second gas showerhead, away from each of the atmospheric transfer module, the first airlock and the atmospheric process module.

In preferred embodiments of the apparatus according to the present invention, the atmospheric transfer module is not equipped with a vacuum pump.

In preferred embodiments of the apparatus according to the present invention, the gas supply system comprises a third gas showerhead positioned in an upper region of the atmospheric process module, and configured to dispense gas downwardly within the atmospheric process module.

In preferred embodiments of the apparatus according to the present invention, the third gas showerhead is positioned adjacent an inlet opening from the atmospheric transfer module.

In preferred embodiments of the apparatus according to the present invention, the gas supply system comprises a second exhaust positioned in the atmospheric process module, and configured to exhaust at least a part of the gas discharged from the third gas showerhead, away from each of the atmospheric transfer module and the atmospheric process module.

In preferred embodiments of the apparatus according to the present invention, the atmospheric process module is not equipped with a vacuum pump.

In preferred embodiments of the apparatus according to the present invention, the atmospheric process module comprises an outer chamber connected to the atmospheric transfer module, and an inner chamber configured to perform wet processing of a wafer-shaped article.

In preferred embodiments of the apparatus according to the present invention, the inner chamber comprises a lower bowl and an upper lid, wherein the lower bowl and the upper lid are vertically movable relative to one other.

In preferred embodiments of the apparatus according to the present invention, the inner chamber accommodates a spin chuck for holding and rotating a wafer-shaped article undergoing processing.

In preferred embodiments of the apparatus according to the present invention, the spin chuck is a levitating chuck.

In preferred embodiments of the apparatus according to the present invention, the atmospheric process module comprises an outer chamber connected to the atmospheric transfer module, and an inner chamber configured to perform wet processing of a wafer-shaped article, and the third gas showerhead is positioned within the outer chamber and outside of the inner chamber.

In preferred embodiments of the apparatus according to the present invention, at least one vacuum process module is attached to the vacuum transfer module independently of the first airlock.

In preferred embodiments of the apparatus according to the present invention, an equipment front end module is connected to the vacuum transfer module via at least one second airlock, the equipment front end module comprising at least one front-opening unified pod for introducing a wafer-shaped article into the equipment front end module and for removing a wafer-shaped article therefrom.

In preferred embodiments of the apparatus according to the present invention, a wafer-shaped article may be introduced into and removed from the atmospheric process module only by passing through the atmospheric transfer module, the first airlock and the vacuum transfer module.

In preferred embodiments of the apparatus according to the present invention, a heater is positioned in at least one of the atmospheric transfer module and the first airlock, the heater being configured to evaporate any residual moisture present on a wafer-shaped article being returned from the atmospheric process module to the vacuum transfer module. Such heater could comprise radiation heater such as LED-heating elements.

In preferred embodiments of the apparatus according to the present invention, the vacuum transfer module comprises a vacuum transfer robot that is operable to transfer a wafer-shaped article from the vacuum transfer module to the first airlock.

In preferred embodiments of the apparatus according to the present invention, the vacuum transfer module comprises a vacuum transfer robot that is operable to transfer a wafer-shaped article from the at least one second airlock to the vacuum transfer module, and from the vacuum transfer module to the first airlock.

In preferred embodiments of the apparatus according to the present invention, the atmospheric transfer module comprises an atmospheric transfer robot that is operable to transfer a wafer-shaped article from the first airlock to the atmospheric transfer module, and from the atmospheric transfer module to the atmospheric process module.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
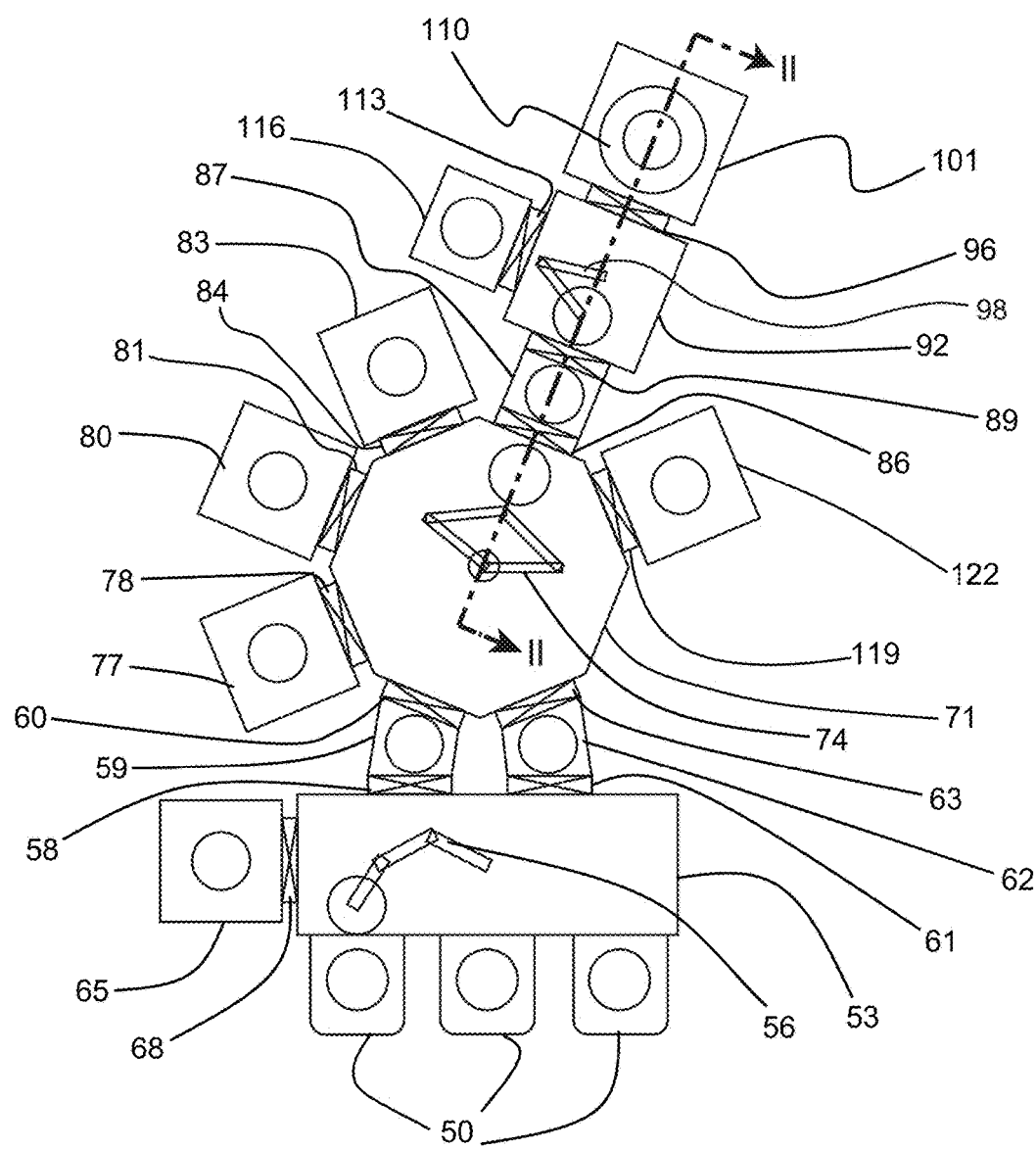
FIG. 1 is a top plan view of an apparatus comprising integrated wet and dry process modules, according to a first embodiment of the invention.

Referring now to the drawings, the system of FIG. 1 comprises a series of Front-Opening Unified Pods (FOUPs) 50, which are the point of entry and exit if wafers to and from the apparatus. An Equipment Front End Module (EFEM) 53, including an EFEM robot 56, is provided for transferring wafers from an FOUP 50 to IN airlock 59, through slot valve 58. EFEM robot 56 likewise transfers wafers from the OUT airlock 62, through slot valve 61, to an FOUP 50. An optional atmospheric inspection module 65 is connected to EFEM 53 via slot valve 68.

IN airlock 59 and OUT airlock 62 are in turn connected to a vacuum transfer module (VTM) 71, via respective slot valves 60 and 63. VTM 71 is equipped with VTM robot 74, which moves a wafer from IN airlock 59 through slot valve 60, to a selected one of first vacuum process module 80 and second vacuum process module 83, through a respective slot valve 81 or 84. Vacuum process modules 80 and 83 are for example process modules for plasma etching.

Alternatively, VTM robot 74 moves a wafer from IN airlock 59 through slot valve 60, to a third vacuum process module 122, through a slot valve 119. The third vacuum process module 122 is for example a deposition module.

VTM robot 74 is also configured to move a wafer from the IN airlock 59 through slot valve 60 to either an optional vacuum inspection module 77, through its associated slot valve 78, or to pass-through module (PTM) 87, through its associated slot valve 86.

For all of the foregoing transfers, the VTM robot is also configured to move a wafer along the opposite path to OUT airlock 62 through its associated slot valve 61, as well as between any selected one of the vacuum process modules 80, 83, 122 and the PTM 87, in either direction.

PTM 87 is itself an airlock that connects VTM 71 and an atmospheric transfer module (ATM) 92, via slot valve 86 on the vacuum side and slot valve 89 on the atmospheric side. ATM 92 is equipped with ATM robot 98, which is configured to transfer a wafer from PTM 87 through slot valve 89 to an atmospheric process module (APM) 101 through slot valve 96. APM 101 is for example a process module for wet cleaning of a semiconductor wafer. APM 101 in this embodiment comprises an inner chamber 110 that encloses a spin chuck, as will be described in greater detail below.

ATM robot 98 is also configured to transfer a wafer from PTM 87 through slot valve 89 to an optional atmospheric inspection module 116 through slot valve 113.

Figure 2:
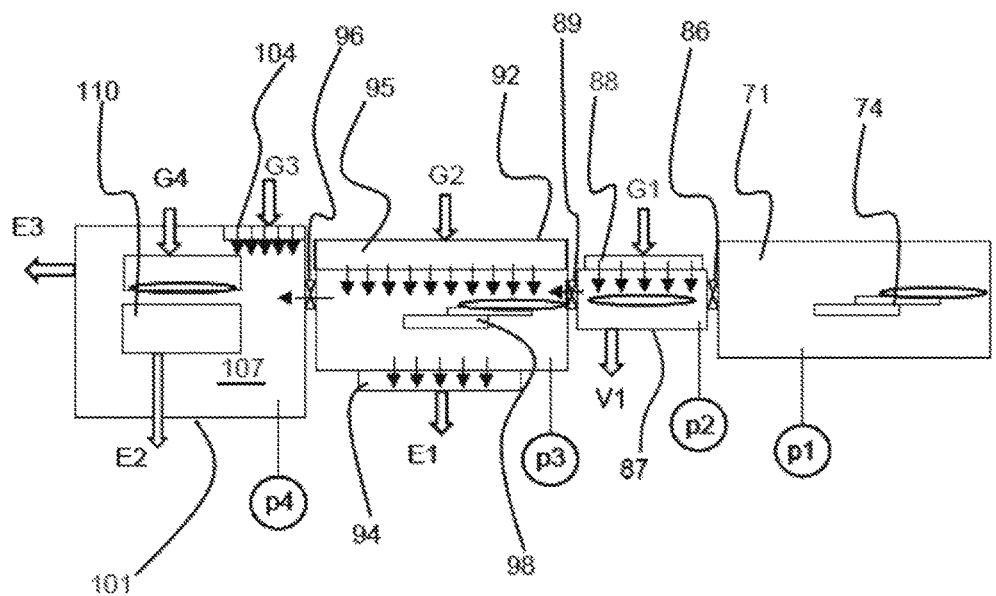
FIG. 2 is a schematic sectional view taken along the line II-II of FIG. 1.

Turning now to FIG. 2, a first pressure p1 prevails within VTM 71, as a wafer is transferred by VTM robot 74. Pass-through module 87 is equipped with an annular gas distributor 88, which provides inert gas such as nitrogen gas to the PTM 87. The annular gas distributer 88 preferably has an inner diameter that is greater than the diameter of the wafer that the apparatus is designed to process, such that the gas outlets of distributor 88 are positioned radially outside of a wafer when present in PTM 87. In this way, gas discharged from the gas distributor 88 will not impinge in a forceful way on the upwardly-facing surface of a wafer when one is present in the PTM 87.

The gas flow generated by gas distributor 88 for purging the PTM 87 is designated G1 in FIG. 2. V1 denotes a vent for evacuating the purging gas from PTM 87. The gas distributor 88 and vent V1 are operated such that a pressure p2 prevails within PTM 87. After the wafer has stabilized within the conditions prevailing within PTM 87, the ATM robot 98 fetches the wafer from PTM 87 through slot valve 89 and brings it into the ATM 92.

ATM 92 is equipped with its own gas distributor 95 for purging the ATM 92 with inert gas, and a gas collector 94 that receives gas so as to exhaust the ATM 92. The gas flow generated by gas distributor 95 is designated G2 in FIG. 2, and the exhaust is designated E1. The gas distributor 95 and gas collector 94 are controlled such that a pressure p3 prevails within the ATM 92.

ATM robot 98 next transfers the wafer from ATM 92 to the APM 101, through slot valve 96. In APM 101, there is an inner chamber 110 that contains a spin chuck on which the wafer is mounted, as described in greater detail below. The space within APM 101 outside of inner chamber 110 is maintained as a controlled environment at a prevailing pressure p4. In particular, a gas distributor 104 is positioned within the outer chamber of APM 101, adjacent the slot valve 96, and generates a downward gas flow G3. The inner chamber 110 also receives its own gas flow G4. Two exhausts are associated with APM 101, an exhaust E2 for the inner chamber 110, and an exhaust E3 for the outer environment 107.

Reference to a vacuum process module herein connotes a module in which the prevailing pressure is less than 10% of atmospheric pressure, preferably 10 torr or less, and more preferably less than 1 torr. Reference to an atmospheric process module herein connotes a module in which the prevailing pressure is in a range of 0.5 to 1.5 bar, and preferably 0.9 to 1.1 bar.

The flows of inert gas G1, G2, G3, G4 described above, as well as the vents and exhausts V1, E1, E2, and E3 are each independently controlled such that the prevailing pressures p1-p4 satisfy the relationship p1>p2>p3>p4, irrespective of the direction of transport of a wafer through the apparatus. In this way, there is a gas flow (when the modules are open toward each other) from PTM 87 to ATM 92, from ATM 92 to the outer chamber environment 107, and from the outer chamber environment 107 to exhaust E3. This enables treating a wafer in a vacuum process module, transferring the wafer for treatment in an atmospheric process module, and then returning the wafer back through the vacuum system, all while excluding oxygen from the vacuum system.

The ATM 92 of this embodiment differs from conventional atmospheric transfer modules in that preferably no vacuum pumps are used. Instead, the pressure within the ATM 92 is controlled via gas flow G2 and a scrubbed exhaust E1. Furthermore, the ATM 92 of this embodiment is preferably fully sealed, which enables a wafer to be transferred from EFEM 53 to a vacuum process module and then to an atmospheric process module, then returning to a vacuum environment and to EFEM 53. This sealed environment also helps prevent the wafer from being exposed to oxygen after plasma etching and before liquid cleaning.

As discussed above, inert gas such as nitrogen is supplied through the disclosed gas distributors, which are in this embodiment annular in shape, of a diameter greater than that of the wafer to be treated, and which are positioned near the top of their respective chamber so as to dispense gas downwardly. Alternatively, the gas distributors could take the form of side-mounted diffusers.

As the gas is preferably not recirculated, the flow of e.g. nitrogen is limited to about 500 slm.

Alternatively, one or more of the gas distributors described herein could take the form of a filter fan unit (FFU), with the gas in that case being recirculated.

The ATM 92 and/or PTM 87 is preferably equipped with a heater (e.g. a radiant heater like a blue LED heating assembly) in order to desorb adsorbed moisture from the wafer (coming from liquid treatment) before it enters into the vacuum system (before it enters the VTM).

Figure 3:
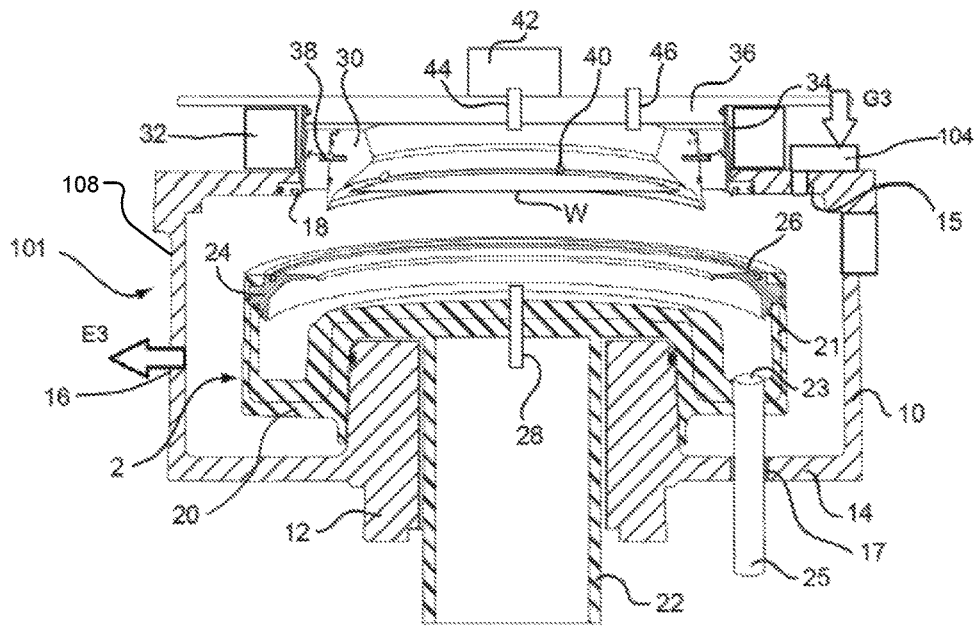
FIG. 3 is a sectional view of a wet processing device suitable for use in the apparatus according to the present invention.

Referring now to FIG. 3, an example of an atmospheric process module 101 is shown. This device is generally as described in commonly-owned copending application Pub. No. 2013/0062839, and reference may be had to that application for any structural details not set forth full herein.

Outer process chamber 108 is preferably made of aluminum coated with PFA (perfluoroalkoxy) resin. The chamber in this embodiment has a main cylindrical wall 10, a lower part/wall 14 and an upper part 15. From upper part 15 there extends a narrower cylindrical wall 34, which is closed by a lid 36. The wafer is preferably loaded and unloaded into the chamber 110 via a side opening (not shown).

A rotary chuck 30 is disposed in the upper part of chamber 108, and surrounded by the cylindrical wall 34. Rotary chuck 30 rotatably supports a wafer W during use of the apparatus. The rotary chuck 30 incorporates a rotary drive comprising ring gear 38, which engages and drives a plurality of eccentrically movable gripping members 40 for selectively contacting and releasing the peripheral edge of a wafer W, as will be described in detail below.

In this embodiment, the rotary chuck 30 is a ring rotor provided adjacent to the interior surface of the cylindrical wall 34. A stator 34 is provided opposite the ring rotor adjacent the outer surface of the cylindrical wall 34. The rotor 30 and stator 32 serve as a motor by which the ring rotor 30 (and thereby a supported wafer W) may be rotated and levitated through an active magnetic bearing. For example, the stator 34 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

The lid 36 has a manifold 42 mounted on its exterior, which supplies a medium inlet 44 that traverses the lid 36 and opens into the chamber above the wafer W. It will be noted that the wafer W in this embodiment hangs downwardly from the rotary chuck 30, supported by the gripping members 40, such that fluids supplied through inlet 44 would impinge upon the upwardly facing surface of the wafer W. The wafer is preferably loaded onto chuck 30 from below, and thus the inner diameter of chuck 30 may be less than that of wafer W. Moreover, the lid 36 need not be removable.

In case wafer W is a semiconductor wafer, for example of 300 mm or 450 mm diameter, the upwardly facing side of wafer W could be either the device side or the obverse side of the wafer W, which is determined by how the wafer is positioned on the rotary chuck 30, which in turn is dictated by the particular process being performed within the chamber 110.

The apparatus of FIG. 3 further comprises an interior cover 2, which is movable relative to the outer chamber 108. Interior cover 2 is shown in FIG. 3 in its first, or open, position, in which the rotary chuck 30 is in communication with the outer cylindrical wall 10 of chamber 108. Cover 2 in this embodiment is generally cup-shaped, comprising a base 20 surrounded by an upstanding cylindrical wall 21. Cover 2 furthermore comprises a hollow shaft 22 supporting the base 20, and traversing the lower wall 14 of the chamber 108.

Hollow shaft 22 is surrounded by a boss 12 formed in the main chamber 108, and these elements are connected via a dynamic seal that permits the hollow shaft 22 to be displaced relative to the boss 12 while maintaining a gas-tight seal with the chamber 108.

At the top of cylindrical wall 21 there is attached an annular deflector member 24, which carries on its upwardly-facing surface a gasket 26. Cover 2 preferably comprises a fluid medium inlet 28 traversing the base 20, so that process fluids and rinsing liquid may be introduced into the chamber onto the downwardly facing surface of wafer W.

Cover 2 furthermore includes a process liquid discharge opening 23, which opens into a discharge pipe 25. Whereas pipe 25 is rigidly mounted to base 20 of cover 2, it traverses the bottom wall 14 of chamber 108 via a dynamic seal 17 so that the pipe may slide axially relative to the bottom wall 14 while maintaining a gas-tight seal.

An exhaust opening 16 traverses the wall 10 of chamber 108, whereas a separate exhaust opening 46 traverses the lid 36 near the inner surface of rotary chuck 30. Each exhaust opening is connected to suitable exhaust conduits (not shown), which are preferably independently controlled via respective valves and venting devices.

The position depicted in FIG. 3 corresponds to loading or unloading of a wafer W. In particular, a wafer W can be loaded onto the rotary chuck 30 either through the lid 36, or, more preferably, through a side door (not shown) in the chamber wall 10. However, when the lid 36 is in position and when any side door has been closed, the chamber 108 is gas-tight and able to maintain a defined internal pressure.

The lower cup 2 is movable vertically relative to outer chamber 108, until sealing gasket 26 on cover 2 contacts the inside of chamber 108 and gasket 18 on the inside of chamber 108 contacts the deflector member 24, thereby to formed a sealed inner chamber 108 in which processing of the wafer W is performed.

As described above, the gas flow G3 is provided into the volume inside chamber 108 and outside of inner chamber 110, and is exhausted through exhaust E3, whereas opening 46 for example can be utilized to admit the inner gas flow G4, which can then be exhausted (E2) for example through pipe 25.

Figure 4:
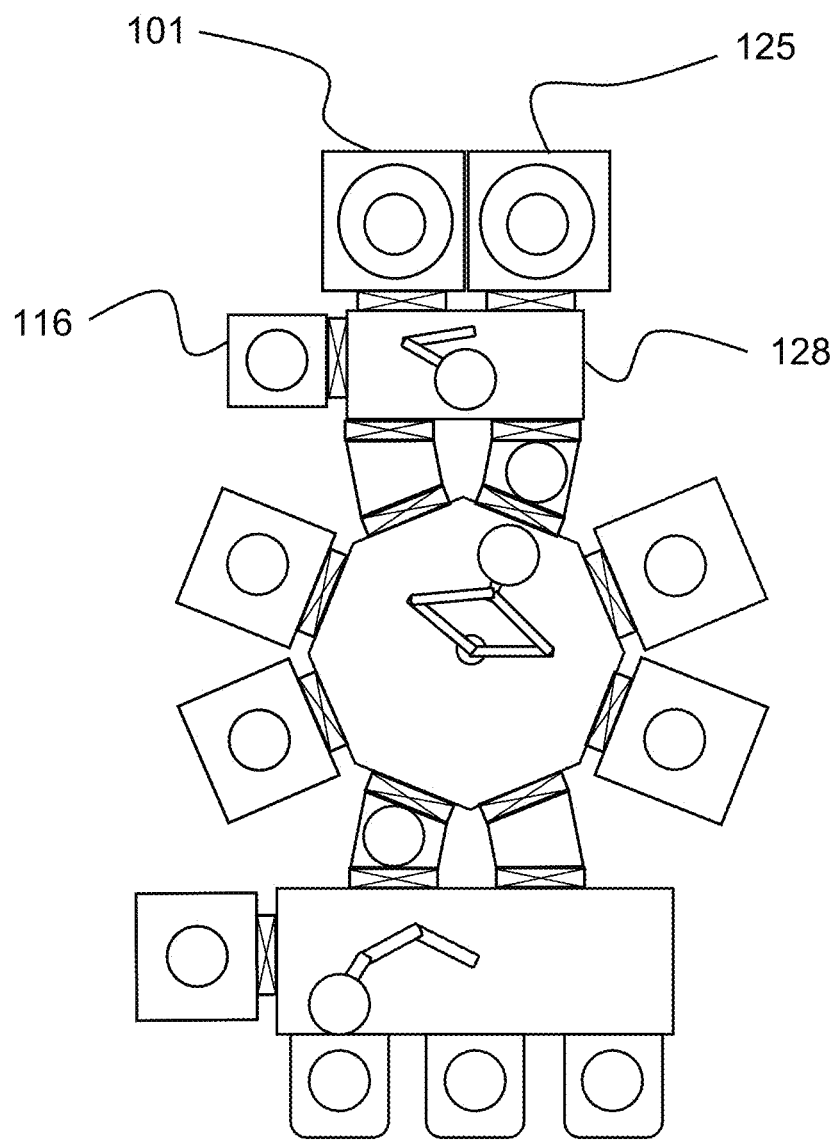
FIG. 4 is a top plan view of an apparatus comprising integrated wet and dry process modules, according to a second embodiment of the invention.

FIG. 4 shows an alternative embodiment in which a second atmospheric process 125 module is provided alongside APM 101. The ATM 128 of this embodiment thus accesses two APMs and also two PTMs, such that one can be used for entry and the other for exit. The embodiment of FIG. 4 is otherwise as described in connection with FIGS. 1-3.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. An apparatus for processing wafer-shaped articles, comprising:
    a vacuum transfer module;
    an atmospheric transfer module;
    a first airlock interconnecting said vacuum transfer module and said atmospheric transfer module;
    an atmospheric process module connected to said atmospheric transfer module; and
    a gas supply system configured to supply gas separately and at different controlled flows to each of said atmospheric transfer module, said first airlock and said atmospheric process module, so as to cause:
    (i) a flow of gas from said first airlock to said atmospheric transfer module when said first airlock and said atmospheric transfer module are open to one another, and
    (ii) a flow of gas from said atmospheric transfer module to said atmospheric process module when said atmospheric transfer module and said atmospheric process module are open to one another,
    wherein the gas supply system includes
        a first gas showerhead positioned in an upper region of said first airlock and configured to dispense gas downwardly within said first airlock,
        a second gas showerhead positioned in an upper region of said atmospheric transfer module and configured to dispense gas downwardly within said atmospheric transfer module, and
        a third gas showerhead positioned in an upper region of said atmospheric process module and configured to dispense gas downwardly within said atmospheric process module, and
    wherein the gas supply system is configured to separately control respective flows of the first gas showerhead, the second gas showerhead, and the third gas showerhead.

2. The apparatus according to claim 1, wherein said first airlock is configured to accommodate at least one wafer-shaped article of a predetermined diameter, and wherein said first gas showerhead comprises downwardly directed gas discharge openings positioned radially outwardly of a wafer-shaped article of said predetermined diameter when positioned in said first airlock.

3. The apparatus according to claim 1, wherein said atmospheric transfer module is configured to accommodate at least one wafer-shaped article of a predetermined diameter, and wherein said second gas showerhead comprises downwardly directed gas discharge openings positioned radially outwardly of a wafer-shaped article of said predetermined diameter when positioned in said atmospheric transfer module.

4. The apparatus according to claim 1, wherein said gas supply system comprises a first exhaust positioned in a lower region of said atmospheric transfer module, and configured to exhaust at least a part of the gas discharged from said second gas showerhead, away from each of said atmospheric transfer module, said first airlock and said atmospheric process module.

5. The apparatus according to claim 1, wherein said atmospheric transfer module is not equipped with a vacuum pump.

6. The apparatus according to claim 1, wherein said third gas showerhead is positioned adjacent an inlet opening from said atmospheric transfer module.

7. The apparatus according to claim 1, wherein said gas supply system comprises a first exhaust positioned in said atmospheric process module, and configured to exhaust at least a part of the gas discharged from said third gas showerhead, away from each of said atmospheric transfer module and said atmospheric process module.

8. The apparatus according to claim 1, wherein said atmospheric process module is not equipped with a vacuum pump.

9. The apparatus according to claim 1, wherein said atmospheric process module comprises an outer chamber connected to said atmospheric transfer module, and an inner chamber configured to perform wet processing of a wafer-shaped article.

10. The apparatus according to claim 9, wherein the inner chamber comprises a lower bowl and an upper lid, wherein the lower bowl and the upper lid are vertically movable relative to one other.

11. The apparatus according to claim 9, wherein the inner chamber accommodates a spin chuck for holding and rotating the wafer-shaped article whilst being processed.

12. The apparatus according to claim 11, wherein the spin chuck is a levitating chuck.

13. The apparatus according to claim 1, wherein said atmospheric process module comprises an outer chamber connected to said atmospheric transfer module, and an inner chamber configured to perform wet processing of a wafer-shaped article, and wherein said third gas showerhead is positioned within said outer chamber and outside of said inner chamber.

14. The apparatus according to claim 1, further comprising at least one vacuum process module attached to said vacuum transfer module independently of said first airlock.

15. The apparatus according to claim 1, further comprising an equipment front end module connected to said vacuum transfer module via at least one second airlock, said equipment front end module comprising at least one front-opening unified pod for introducing a wafer-shaped article into said equipment front end module and for removing a wafer-shaped article therefrom.

16. The apparatus according to claim 15, wherein said vacuum transfer module comprises a vacuum transfer robot that is operable to transfer a wafer-shaped article from said at least one second airlock to said vacuum transfer module, and from said vacuum transfer module to said first airlock.

17. The apparatus according to claim 1, wherein a wafer-shaped article may be introduced into and removed from said atmospheric process module only by passing through said atmospheric transfer module, said first airlock and said vacuum transfer module.

18. The apparatus according to claim 1, further comprising a heater positioned in at least one of said atmospheric transfer module and said first airlock, said heater being configured to evaporate any residual moisture present on a wafer-shaped article being returned from said atmospheric process module to said vacuum transfer module.

19. The apparatus according to claim 1, wherein said vacuum transfer module comprises a vacuum transfer robot that is operable to transfer a wafer-shaped article from said vacuum transfer module to said first airlock.

20. The apparatus according to claim 1, wherein said atmospheric transfer module comprises an atmospheric transfer robot that is operable to transfer a wafer-shaped article from said first airlock to said atmospheric transfer module, and from said atmospheric transfer module to said atmospheric process module.

* * * * *